United States Patent [19]
Tollbom

[11] Patent Number: 5,793,614
[45] Date of Patent: Aug. 11, 1998

[54] INJECTOR/EJECTOR FOR ELECTRONIC MODULE HOUSING

[75] Inventor: Bruce C. Tollbom, Beaverton, Oreg.

[73] Assignee: Tektronix, Inc., Wilsonville, Oreg.

[21] Appl. No.: 953,491

[22] Filed: Oct. 17, 1997

Related U.S. Application Data

[63] Continuation of Ser. No. 707,788, Sep. 3, 1996, abandoned.

[51] Int. Cl.$^6$ .................................................. H05K 01/18
[52] U.S. Cl. .................. 361/732; 439/157; 439/160; 439/325; 439/327; 361/726; 361/725; 361/801; 361/802; 361/754
[58] Field of Search ........................... 439/157, 160, 439/327, 325; 361/732, 796, 752, 715, 725, 729, 741, 802, 801, 726, 740, 754, 756, 759

[56] References Cited

U.S. PATENT DOCUMENTS

| | | | |
|---|---|---|---|
| 4,996,631 | 2/1991 | Freehauf | 361/798 |
| 5,139,430 | 8/1992 | Lewis et al. | 439/157 |
| 5,222,897 | 6/1993 | Collins et al. | 439/157 |
| 5,293,303 | 3/1994 | Fletcher et al. | 361/798 |
| 5,309,325 | 5/1994 | Dreher et al. | |
| 5,542,854 | 8/1996 | Bowen | 439/157 |

*Primary Examiner*—Leo P. Picard
*Assistant Examiner*—David Foster
*Attorney, Agent, or Firm*—Bennet K. Langlotz; Thomas F. Lenihan

[57] ABSTRACT

An injector/ejector mechanism with a lever pivotally connected to a module faceplate to pivot about a pivot axis. The lever has a handle extending away from the faceplate, and a latch portion extending away from the faceplate in a direction opposite the handle portion. The latch portion includes a first tooth and a second tooth, the first tooth being positioned farther from the faceplate than is the second tooth. The lever is movable between a first position in which the first tooth extends laterally from the pivot axis by a limited first amount, and a second position in which the first tooth extends laterally from the pivot axis by a greater second amount, and the lever is spring biased toward the first position.

17 Claims, 5 Drawing Sheets ary of a module faceplate, and which are uncomfortable to users' fingers when large forces must be applied. Also, these levers can use valuable front panel

INJECTOR/EJECTOR FOR ELECTRONIC MODULE HOUSING

This is a continuation of application Ser. No. 08/707,788 filed Sep. 3, 1996 which is now abandoned.

FIELD OF THE INVENTION

The invention relates to modular electronic instrument systems, and more particularly to mechanisms for installing and removing modules from such systems.

BACKGROUND AND SUMMARY OF THE INVENTION

Modular instrument systems permit a variety of different electronic instruments to be installed and interconnected in a single chassis. To create a customized system of test, measurement, and analysis equipment, such as for automated testing, a user selects the required modules, and installs them in a chassis that provides power, cooling, and functional electronic interconnection to the modules. Typically, the chassis is in the form of a cabinet with a large front aperture in which modules may be inserted side-by-side in the manner of books on a bookshelf. An example of such a system is a VXI (VME Extension for Instrumentation) test chassis using the VXIbus standard.

In typical VXI systems, the chassis or mainframe is a box with an open side, and with electronic connectors mounted to the interior of the box opposite the open side. Each module has a faceplate or front panel at one end, and one or more electronic connectors on the "nose" end opposite the face plate, so that the module connectors mate with the chassis connectors when the module is installed nose first into the chassis opening. As installed, the face plate is the only exposed portion of the module, and adjacent module face plates are flush to present a uniform appearance.

With the increasing number of connections required in a VXI module, substantial force is required to fully seat and remove modules. For instance, modules may have 3 or 4 DIN connections, each of which can require up to 20 pounds of insertion force. Consequently, mechanisms have been developed for providing additional leverage to drive the connectors home, and to extract them for removal of the module. This avoids the need for substantial force or impact against the module that may damage the equipment, or may move the chassis undesirably.

Existing lever mechanisms include levers that have handles extending from the face plate, and a claw extending toward a rail at the chassis opening. One tooth of the claw serves to engage the back side of the rail as the lever is actuated, to draw the module into connection with the chassis. A second tooth closer to the faceplate serves to push against the outer surface of the rail as the lever is pivoted in the opposite direction, pulling the module free of the connectors. However, existing levers are susceptible to damage if the lever is in an improper position in which the first tooth fails to clear the rail on insertion. Also, existing geometries that provide a first tooth short enough to clear the rail may not have a long enough tooth to fully draw in the module, requiring the use of panel screws to drive the module home. Existing levers may also present an unattractive appearance, as adjacent modules may have levers disposed at different angles after module installation, creating a nonuniform result. Other levers employ long, narrow handles that are stowed along the long edge of a module faceplate, and which space that may cause interference with a desired connection for input and output devices.

The embodiment disclosed herein overcomes these disadvantages by providing an injector/ejector mechanism with a lever pivotally connected to a module faceplate to pivot about a pivot axis. The lever has a handle extending away from the faceplate, and a latch portion extending away from the faceplate in a direction opposite the handle portion. The latch portion includes a first tooth and a second tooth, the first tooth being positioned farther from the faceplate than is the second tooth. The lever is movable between a first position in which the first tooth extends laterally from the pivot axis by a limited first amount, and a second position in which the first tooth extends laterally from the pivot axis by a greater second amount, and the lever is spring biased toward the first position.

DETAILED DESCRIPTION OF A PREFERRED EMBODIMENT

Figure 1:
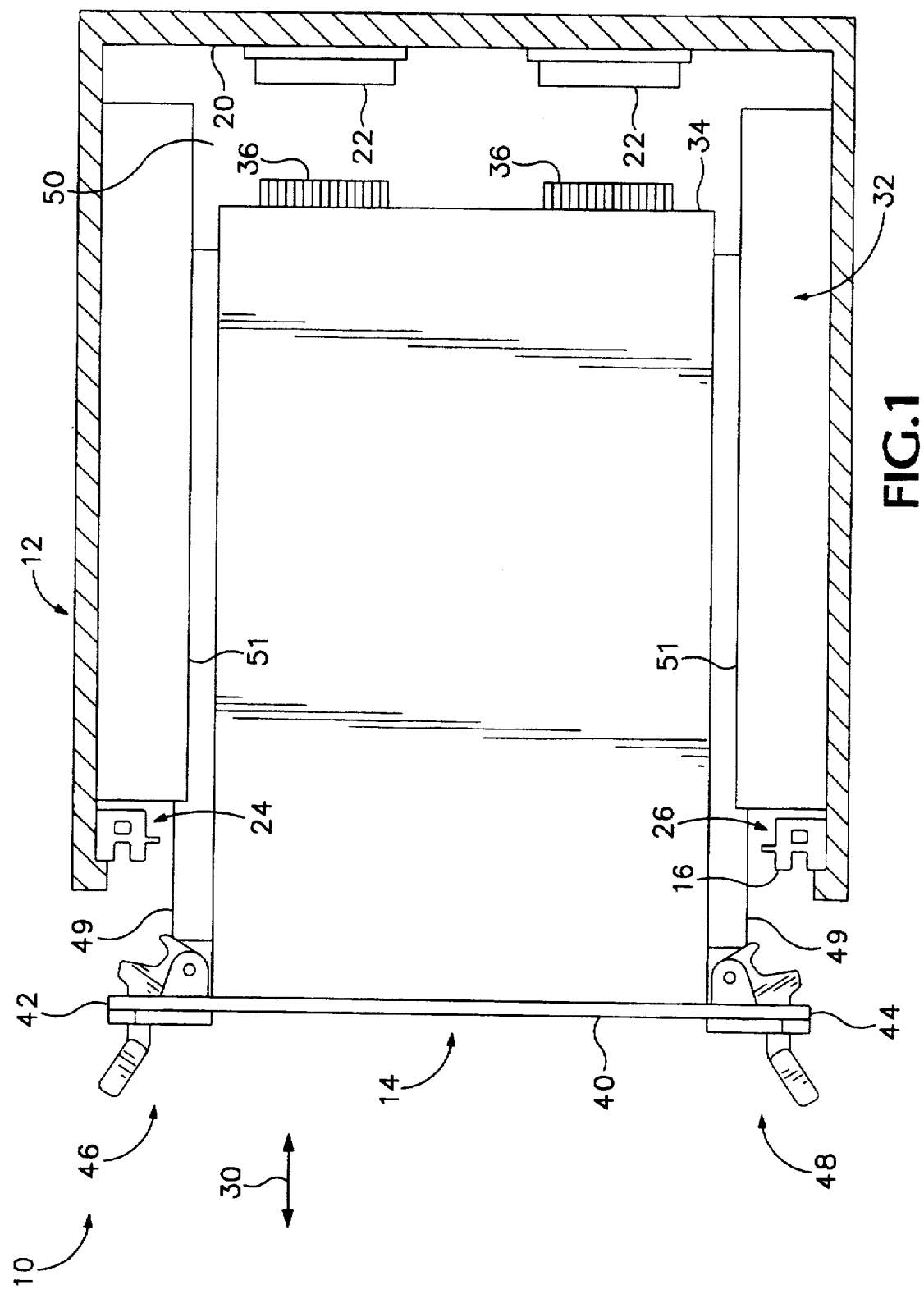
FIG. 1 is a sectional side view of a module and mainframe chassis according to a preferred embodiment of the invention.

FIG. 1 shows a modular electronic system 10 having a mainframe chassis 12 and a removable module 14. The chassis is in the shape of a box, with a front opening 16 and a rear wall 20 on which connectors 22 are mounted. At the upper and lower edges of the opening 16, upper and lower rails 24, 26 are mounted to protrude toward each other to define the narrowest vertical dimension of the opening. A slide axis 30 extends perpendicularly to the rear wall 20 and to the rails 26.

The module 14 includes a housing 32 having opposed major surfaces that face similar modules (not shown) mounted adjacently, or the side walls of the chassis. A rearwardly facing nose panel 34 faces toward the rear wall 20 of the chassis, and has protruding connectors 36 that mate with connectors 22, and which are connected to electronic components (not shown) within the housing 32. An elongated face plate 40 covers the front of the module housing, and is oriented normal to the slide axis 30. The face plate has upper and lower ends 42, 44 that respectively extend above and below the housing to form flanges that rest against the front edges of the rails 26 when installed. A pair of injector/ejector mechanisms 46, 48 are connected to the face plate at the respective upper and lower ends 42, 44.

The module 14 slides into and out of the chassis 12 along the slide axis 30. The module has upper and lower fins 49 that slide within grooved guides 51 mounted to the upper and lower surfaces of the chassis chamber 50 to maintain the module in a vertical orientation and to align its connectors 36 with the chassis connectors 22.

Figure 2:
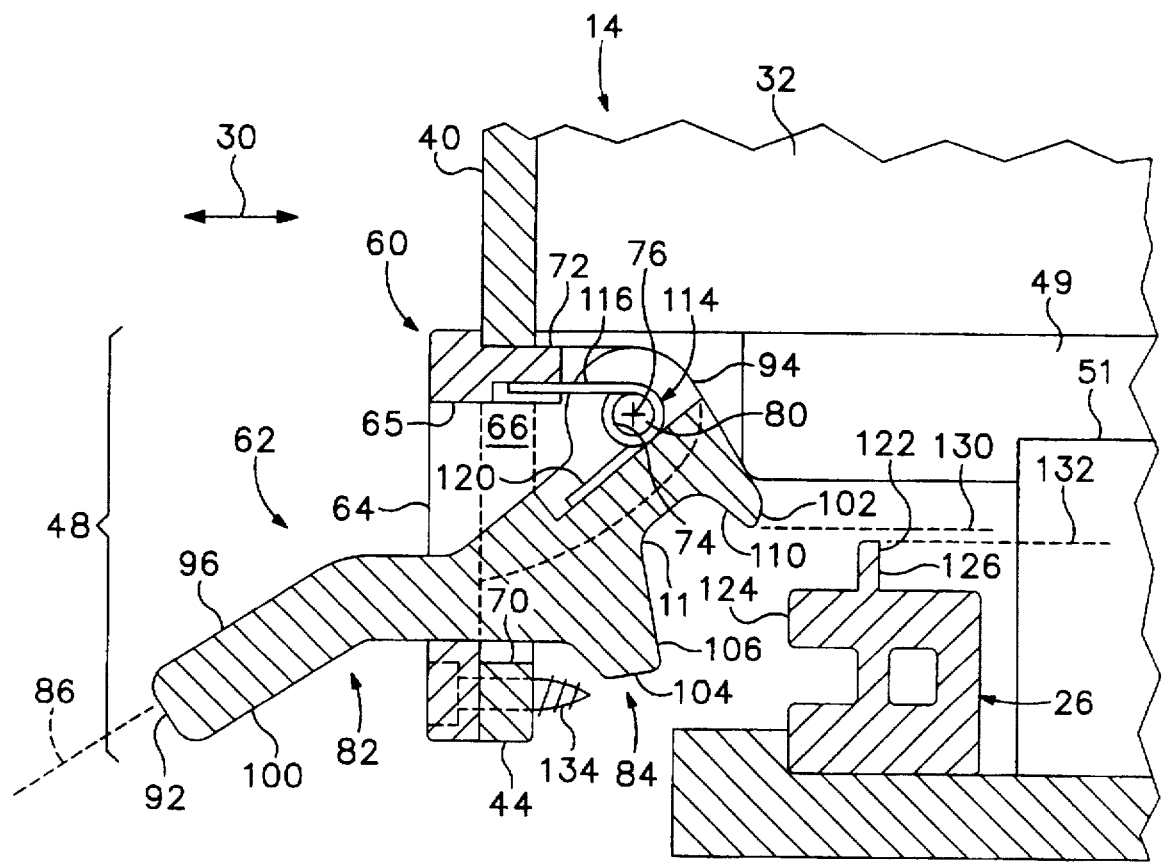
FIG. 2 is an enlarged sectional side view of an injector/ejector mechanism of the embodiment of FIG. 1.
Figure 2:
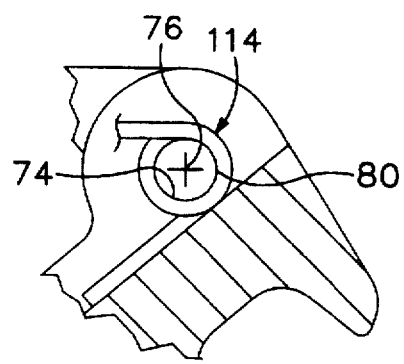

FIG. 2 shows the lower injector/ejector mechanism 48, which is essentially a mirror image of mechanism 46, as reflected about a horizontal plane. Mechanism 48 includes a frame 60 and a lever 62 pivotally mounted to the frame.

The frame includes a planar front panel 64 mounted against the front surface of the module face plate 40, covering the width of the face plate and a major portion of the length of the lower end flange 44. The panel 64 defines a rectangular aperture 65 permitting passage of the lever, as will be discussed below. The frame may be screwed to the face plate, or fastened by any other conventional means.

The frame further includes a pair of rearwardly protruding stanchions 66 that extend through a rectangular hole 70 in the face plate 40 that is registered with the panel aperture 65. The stanchions are spaced apart to define a gap that closely receives the lever 62, and are oriented in vertical planes parallel to the slide axis 30. A horizontal web panel 72 spans between the upper edges of the stanchions, and extends from the front panel, through hole 70, to an intermediate point about midway between the front panel and the rearmost free ends of the stanchions. A pair of coaxial pivot holes 74 penetrate the stanchions near their free ends, and are aligned on a pivot axis 76 oriented parallel to the chassis rail 26, and perpendicular to the major faces of the module.

A pin 80 is tightly received in the holes 74 to serve as a pivot axle for the lever 62. The pivot axis 76 is positioned close to the upper edges of the stanchions (on the corresponding upper mechanism 46 close to the lower edges,) which extend parallel to the slide axis. This permits the pivot axis to be located as close as possible to the medial edge of the hole 70, while reserving as much space as possible on the faceplate between the holes 70 for functional components such as connectors, displays, and switches.

Figure 3:
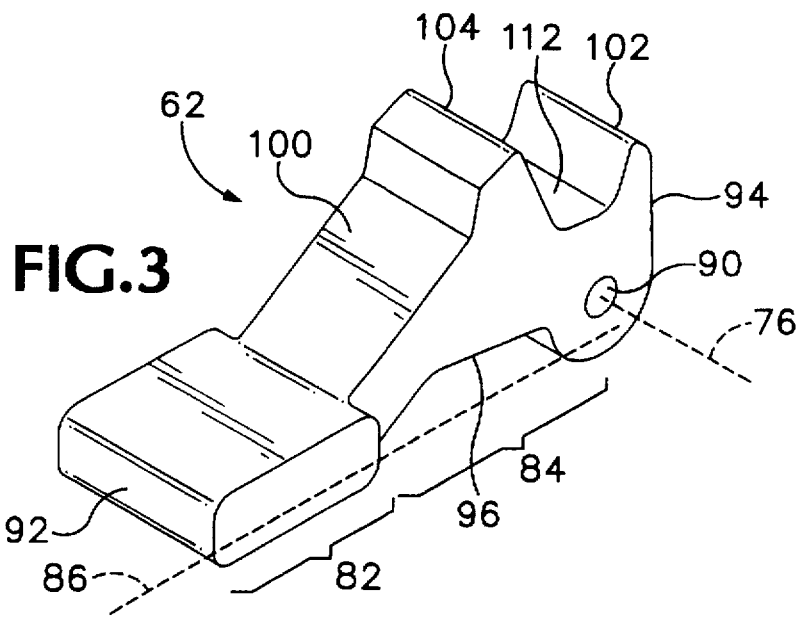
FIG. 3 is an isometric view of a lever component of the embodiment of FIG. 1.

As shown in FIG. 3, the lever 62 has a handle portion 82 that extends forward from the face plate for manipulation by a user, and a latch portion 84 that extends rearwardly through aperture 65 and hole 70, to the rear side of the face plate 40. The handle 82 is a flat, wide planar member that is nearly parallel to a lever plane 86. In the preferred embodiment, the handle surfaces are offset laterally from the handle plane by about 6 degrees to provide effective manual contact during injection. The lever plane extends through the length of the handle to approximately intersect the pivot axis 76, on which a bore 90 is defined for receiving the pivot pin 80 as shown in FIG. 2. Thus, a force approximately normal to the plane of the handle will efficiently pivot the handle.

The lever extends from a front handle end 92 to a rear latch end 94, and has a medial side 96 and a lateral side 100. As shown in FIG. 2, the lateral side faces away from the body of the module toward the chassis rail 26. On the lateral side 100 of the latch portion 84 at the rear end 94, a first tooth 102 extends laterally (i.e. substantially perpendicular to the handle plane 86) for a limited distance. With the bore 90 as near the rear end of the lever as is structurally possible, and the rear end of the tooth being a flat plate substantially perpendicular to the handle plane 86, the first tooth extends substantially perpendicularly to the handle plane. Thus, upward movement of the handle 82 will generate axial movement of the first tooth along the slide axis.

A second tooth 104 also extends laterally from the latch portion by a greater distance from the handle plane 86 than does the first tooth, so that the second tooth may engage an obstacle that the first tooth clears. The second tooth is spaced apart from the first tooth, with a rear surface 106 of the second tooth facing the first tooth 102, and a front surface 110 of the first tooth facing the second tooth, defining a gap 112 therebetween.

As shown in FIG. 2, a wire torsion spring 114 is positioned to receive the pin 80 within the bore defined by its coil, and has arms extending from the respective ends of the coil. A first spring arm 116 presses upwardly into a pocket on the underside of web 72, and a second arm 120 presses downwardly into a pocket on the upper side of the lever. Thus, the lever is spring biased into the resting position shown in FIG. 2.

The rail 26 is an elongated bar that spans the width if the chassis, one on each of the upper and lower sides of the chassis opening 16. A spline 122 extends from the middle of the surface of the rail that faces the opening and the opposed rail (in the illustrated lower rail 26 the spline extends upward from the upper surface.) Each spline runs the length of each rail. Each rail has a front surface 124 that faces the forward direction, and each spline 122 has a rear surface 126 that faces the rear of the chassis. The rear surface of the spline is spaced apart from the front edge of the slide groove member 51 by a distance of 0.140 inch (3.6 mm) in typical VXI applications. Therefore, the first tooth of the lever should have the illustrated thin profile so that it does not extend excessively toward the rear of the module when the lever is pivoted downward.

Figure 4A:
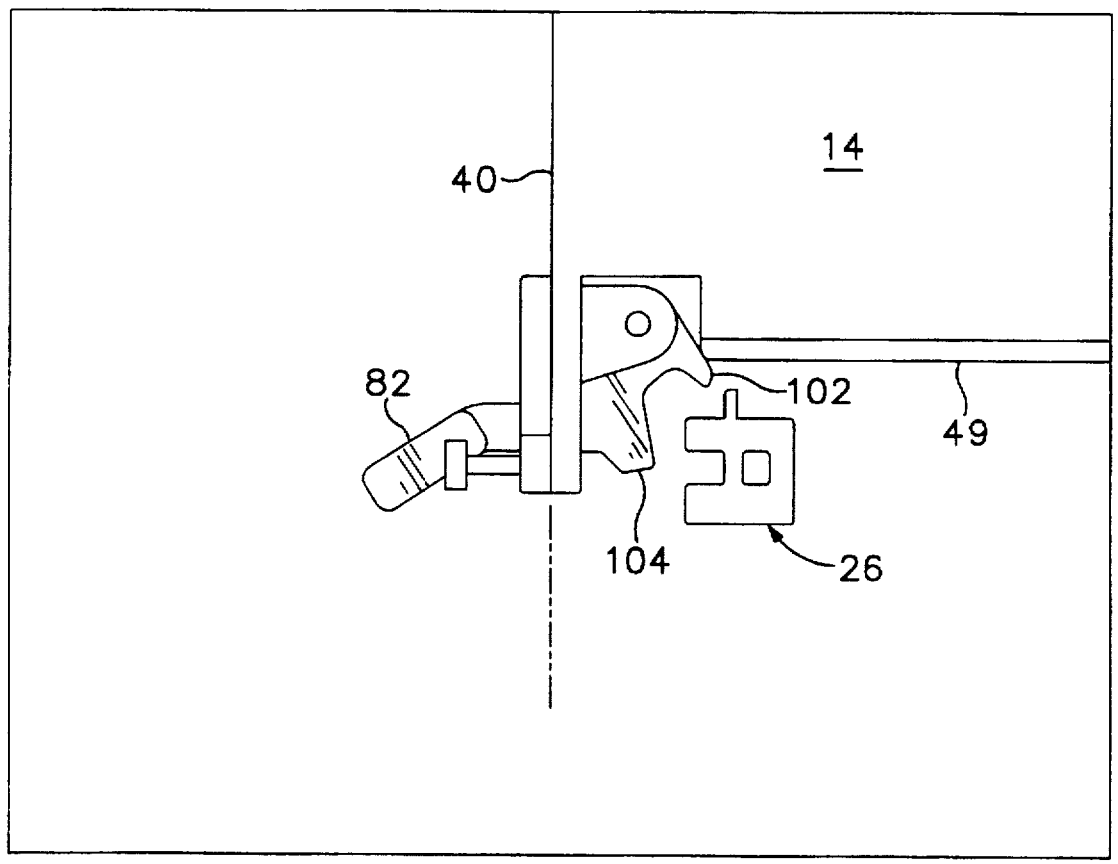
FIGS. 4A–4E are simplified enlarged sectional side views of an injector/ejector mechanism of the embodiment of FIG. 1 in various stages of operation.

FIGS. 4A–4E show the sequence of operation of the injector/ejector mechanism. FIG. 4A shows the mechanism in a stable, resting state, in which the module 14 is uninstalled. As similarly shown in FIG. 2, the lever is spring biased laterally way from the chassis so that the handle 82 rests against the aperture 65 of the frame. In this position, the first tooth 102 is retracted to an elevated level 130 that is above the level 132 of the tip of the spline 122. The ensures that the first tooth remains clear of the rail to avoid the damage that might occur if the lever were mispositioned. The second tooth extends to a level at an intermediate point on the front surface 124 of the rail 26.

Figure 4B:
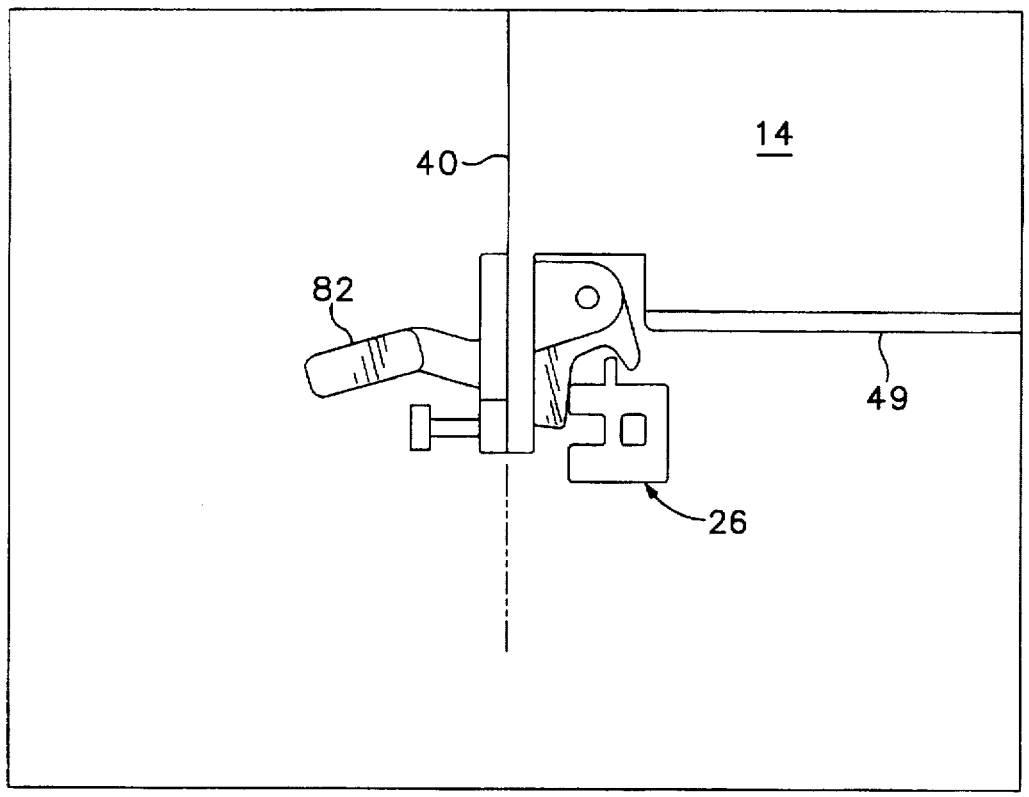

FIG. 4B shows the apparatus in a partially installed position, such as after a user has slid the module into the chassis as far as possible until the connectors at the rear of the module meet with substantial insertion resistance. The faceplate 40 is spaced apart from the rail 26, and the lever has been pushed toward the middle of the instrument by contact of the second tooth 104 with the front surface 124 of the rail 26. The gap 112 between the teeth is just wide enough so that the first tooth 102 is beyond the spline 122 when lever pivoting occurs, such that the first tooth does not limit the initial pivoting.

Figure 4C:
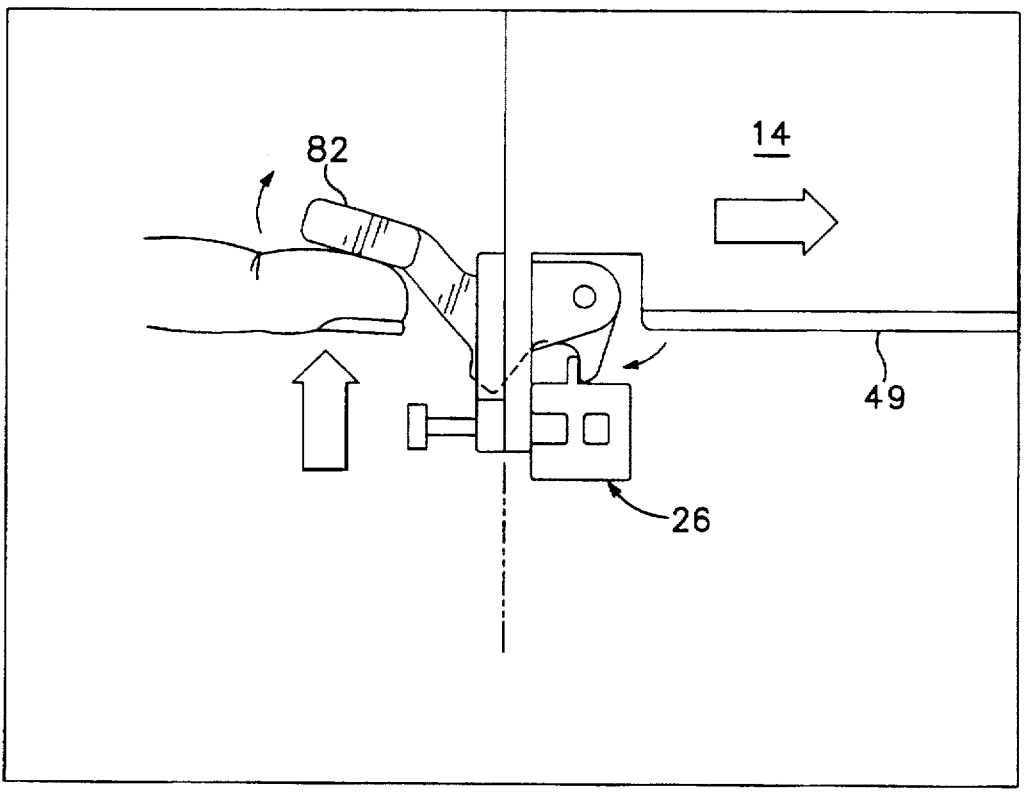

In FIG. 4C, a user is pressing medially on both lever handles 82 to fully mate the connectors. The face plate 40 rests against the rail 26. Because of the relatively large distance between the pivot axis and the point at which force is applied to the handle, as compared to the radial distance between the pivot axis and the point of contact at the tip of the first tooth, substantial leverage is attained. Because the front surface 110 of the first tooth is nearly radial to the pivot axis, there is very little camming or sliding effect that might increase wear or require excessive force by the user. Because the first tooth extends nearly perpendicularly to the handle, a medial motion of the handle directly toward the opposite handle in a "pinching" motion generates a force closely aligned along the slide axis, making efficient use of the user's force. This also provides that the applied forces are equal and opposed, so that the chassis is not moved in response to the force.

Figure 4D:
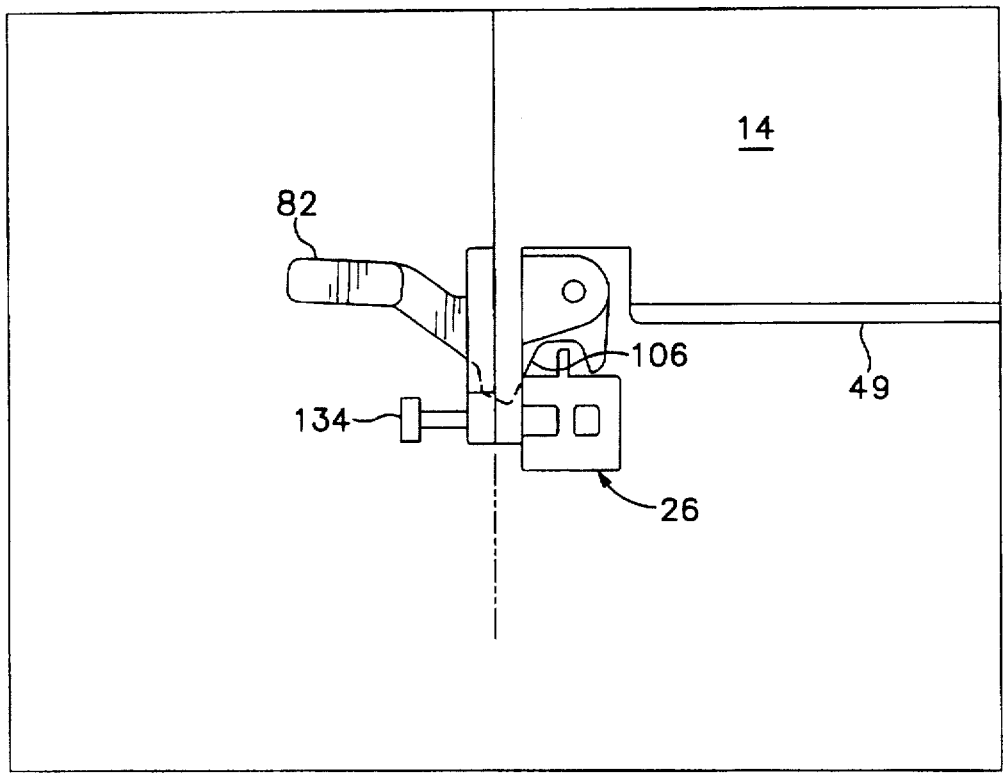

FIG. 4D shows the module fully installed, with the lever at rest. The rear surface 106 of the second tooth 104 is biased by the spring to rest against the rail 26. This provides a uniform appearance when several modules are installed side by side, as the levers are all registered too the same rail. Also, if a user failed to fully install a module, but left it in the partially installed position shown in FIG. 4B, the different handle angle of the inadequately installed module would provide visual notice of the error. To prevent inadvertent disconnection of the module, screws 134 are screwed into tapped bores in the rail. Because the screws are not used to generate force to urge the module into place, the screws may be relatively small, requiring minimal face plate space that is required for functional components.

Figure 4E:
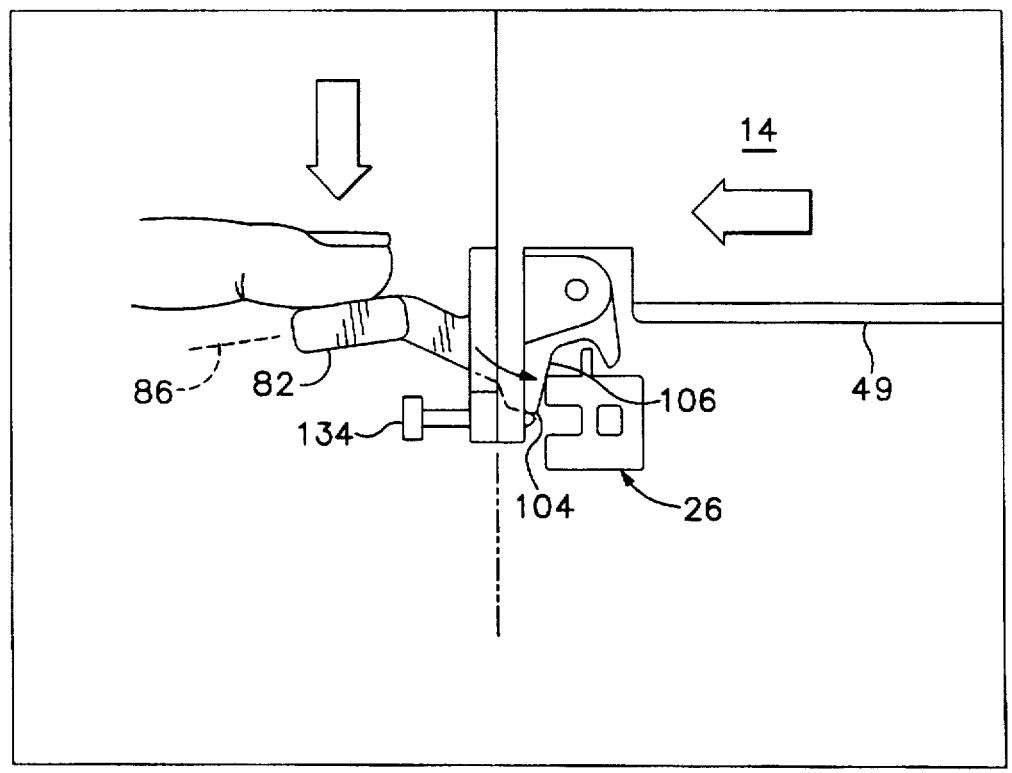

The ejection process is shown in FIG. 4E. With screws 134 disengaged, handles 82 are pressed laterally away from each other. As with the step of FIG. 4C, this provides the benefits of balanced forces. The rear surface 106 of tooth 104 presses against the fixed rail, extracting the module from the chassis. The rear surface 106 is substantially radial to the pivot axis, avoiding wear and excessive force as discussed above, and is angularly offset from the handle plane 86 by 66 degrees. This offset should be as large as possible, preferably greater than 60 degrees.

In the preferred embodiment the lever and frame components are made of a rigid plastic such as 10% glass filled polycarbonate/ABS blend. The surface handle 82 exposed for manipulation is 0.59 inch (15 mm) wide and 0.59 inch (14 mm) long, providing a comfortable pad for fingertips to apply substantial force if needed. Preferably the handle surface should be no smaller than 0.40 inch (10 mm) square. The first tooth 102 extends radially 0.382 inch (9.7 mm) from the pivot axis, perpendicular to the handle plane, and the second tooth 104 extends radially 0.607 inch (15.4 mm) from the pivot axis, and 0.52 inch (13 mm) from the handle plane. The handle has an angular range of motion of 60 degrees. From the installed position shown in FIG. 4D, there is a 17 degree range of motion for injection, and a 43 degree motion for ejection. When in the uninstalled position, the first tooth should clear the rail spline by about 0.04 inch (1 mm), and when leveraging the module into place, should overlap the spline by 0.94 inch (2.4 mm).

While the disclosure is made in terms of a preferred embodiment, the invention is not intended to be so limited.

I claim:

1. A modular electronic instrument system comprising:
   a mainframe having at least top, bottom and rear members and an open frontal area, the mainframe defining a chamber having an interior surface;
   a plurality of module slots extending into the mainframe chamber from the open frontal area to the rear member;
   a plurality of electronic connectors connected to the interior surface;
   the module slots of the mainframe including a rigid rail;
   a plurality of electronic modules adapted for insertion into respective module slots in electrical communication with the mainframe connectors, each module including a housing containing an electronic component and having a face plate having a front side facing away from the housing, and a rear side facing the connectors;
   each module having a spring-biased pivoting lever connected to the face plate and registered with the rail when the module is installed in the mainframe;
   each lever being pivotally mounted to pivot about a pivot axis positioned on the rear side of the face plate, and having a handle extending from the front side of the face plate;
   each lever having a pair of laterally extending teeth defining a gap adapted for receiving at least a portion of the rail when the module is fully installed;
   the lever being movable between a first medial position and a second lateral position, at least a portion of a first one of the teeth being positioned rearwardly of the pivot axis when the lever is in the lateral position; and
   the lever being spring biased toward the lateral position such that the first tooth is maintained clear of the rail during installation of the module.

2. The apparatus of claim 1 wherein the lever includes a handle extending substantially perpendicular to the plane of the face plate when the lever is in the medial position.

3. The apparatus of claim 1 wherein the first tooth extends substantially perpendicular to a plane containing the handle and the pivot axis.

4. The apparatus of claim 1 wherein the first tooth has an injector surface facing the gap, and wherein the injector surface is substantially radial to the pivot axis.

5. The apparatus of claim 1 wherein the second tooth is biased against the rail when the module is installed in the mainframe.

6. The apparatus of claim 1 wherein the levers are positioned on opposite ends of the faceplate, and centered on a median line of the faceplate.

7. The apparatus of claim 1 wherein the handle includes a planar surface oriented substantially normal to its direction of pivoting movement, such that force may be distributed across the surface to operate the lever.

8. The apparatus of claim 7 wherein the handle has a width measured along a line parallel to the pivot axis greater than 10 mm, such that the handle may be operated comfortably by a fingertip.

9. An injector/ejector mechanism for facilitating the insertion and removal of an electronic module from a mainframe housing having a fixed frame element, the module having a faceplate with an external surface, and being slidable within a slot along a slide axis perpendicular to the faceplate within the mainframe, the mechanism comprising:
   a lever pivotally connected to the faceplate to pivot about a pivot axis;
   the lever having a handle portion extending from the faceplate away from the external surface;
   the lever having a latch portion extending away from the faceplate in a direction opposite the handle portion;
   the latch portion including a first tooth and a second tooth, the teeth extending laterally relative to the slide axis and being spaced apart to define a gap;
   the first tooth being positioned farther from the faceplate than is the second tooth;
   the lever being movable between a first position in which the first tooth extends laterally from the pivot axis by a limited first amount, and a second position in which the first tooth extends laterally from the pivot axis by a greater second amount, such that the first tooth is clear of the frame element to facilitate insertion when the lever is in the first position, and such that the first tooth engages the frame element when the lever is moved to the second position, whereby the module may be leveraged into the mainframe by biasing the lever toward the second position; and
   the lever being spring biased to the first position.

10. The apparatus of claim 9 wherein the second tooth extends laterally by a third amount greater than first amount when the lever is in the first position, such that second tooth engages frame element upon insertion of the module into the mainframe.

11. The apparatus of claim 9 wherein the second tooth is positioned closer to the faceplate than is the pivot axis, such that actuation of the handle in the direction the teeth extend causes the second tooth to move away from the face plate, whereby ejection of the module is facilitated.

12. The apparatus of claim 9 wherein the first tooth is positioned farther from the face plate than is the pivot axis when the lever is in the first position, such that movement of the handle in the direction away from the direction the teeth extend causes the first tooth to extend to the greater second amount.

13. The apparatus of claim 9 wherein the handle extends substantially perpendicularly from the faceplate when in the second position.

14. The apparatus of claim 9 wherein the handle includes a planar element extending substantially radially from the pivot axis, such that a force normal to the planar element will tend to pivot the lever.

15. The apparatus of claim 9 wherein the planar element of the handle has a width of at least 1.0 cm. such that substantial force may be applied while distributed over a substantial area of a user's fingertip.

16. The apparatus of claim 9 including a spring connected to the faceplate and the lever.

17. The apparatus of claim 9 wherein the pivot axis is spaced apart from the faceplate by a greater distance than the width of the gap between the first and second teeth.

* * * * *